United States Patent
Huang et al.

(10) Patent No.: US 7,224,005 B2
(45) Date of Patent: May 29, 2007

(54) HETEROJUNCTION BIPOLAR TRANSISTOR STRUCTURE

(75) Inventors: Chao-Hsing Huang, Mingjian Township, Nantou County (TW); Yu-Chung Chin, Jhongli (TW); Min-Nan Tseng, Jhonghe (TW); Huai-Tung Yang, Taipei (TW); Kun-Chuan Lin, Taipei (TW); Shih-Jane Tsai, Dajia Township, Taichung County (TW)

(73) Assignee: Visual Photonics Epitaxy Co., Ltd., Taoyuan (TW)

( * ) Notice: Subject to any disclaimer, the term of this patent is extended or adjusted under 35 U.S.C. 154(b) by 168 days.

(21) Appl. No.: 10/934,891

(22) Filed: Sep. 3, 2004

(65) Prior Publication Data

US 2005/0051799 A1    Mar. 10, 2005

(30) Foreign Application Priority Data

Sep. 5, 2003    (TW) .............................. 92216107 U

(51) Int. Cl.
*H01L 29/737*    (2006.01)

(52) U.S. Cl. ............... 257/198; 257/197; 257/E29.188; 257/E29.033; 438/312

(58) Field of Classification Search ........ 257/197–198, 257/E29.033

See application file for complete search history.

(56) References Cited

U.S. PATENT DOCUMENTS

| | | | | |
|---|---|---|---|---|
| 4,835,579 A | * | 5/1989 | Ishibashi et al. ............... | 257/17 |
| 5,150,185 A | * | 9/1992 | Yamada ...................... | 257/197 |
| 5,365,077 A | * | 11/1994 | Metzger et al. ............... | 257/15 |
| 5,404,028 A | * | 4/1995 | Metzger et al. ............... | 257/15 |
| 6,320,212 B1 | * | 11/2001 | Chow .......................... | 257/197 |
| 6,847,060 B2 | * | 1/2005 | Welser et al. ................ | 257/197 |
| 2003/0213973 A1 | * | 11/2003 | Yoshioka et al. ........... | 257/183 |
| 2004/0149994 A1 | * | 8/2004 | Yi et al. ....................... | 257/79 |
| 2004/0214401 A1 | * | 10/2004 | Krueger et al. ............. | 438/317 |

* cited by examiner

*Primary Examiner*—Jerome Jackson
*Assistant Examiner*—Paul Budd

(57) ABSTRACT

A material made by arranging layers of gallium-arsenide-antimonide ($GaAs_xSb_{1-x}$, $0.0 \leq x \leq 1.0$) and/or indium-gallium-arsenic-nitride ($In_yGa_{1-y}As_zN_{1-z}$, $0.0 \leq y, z \leq 1.0$) in a specific order is used to form the transistor base of a heterojunction bipolar transistor. By controlling the compositions of the materials indium-gallium-arsenic-nitride and gallium-arsenide-antimonide, and by changing the thickness and order of the layers, the new material would possess a specific energy gap, which in turn determines the base-emitter turn-on voltage of the heterojunction bipolar transistor.

14 Claims, 8 Drawing Sheets

HETEROJUNCTION BIPOLAR TRANSISTOR STRUCTURE

BACKGROUND OF THE INVENTION

1. Field of the Invention

The present invention relates to the heterojunction bipolar transistors, and in particular to a structure of the heterojunction bipolar transistors allowing a better control of the base-emitter turn-on voltage.

2. The Prior Arts

The operation principle of the heterojunction bipolar transistor (HBT) lies in that the base-emitter turn-on voltage (Vbe) is correlated to the energy gap of the material forming the transistor base of the HBT. That is, the larger the energy gap is, the higher the base-emitter turn-on voltage gets. Therefore, prior arts generally achieve a specific base-emitter turn-on voltage by selecting a base material with a specific energy gap.

FIG. 1 shows a structure of a typical HBT according to a prior art. As shown in FIG. 1, the epitaxy structure 1 of the HBT contains a subcollector layer 11, a collector layer 12, a base layer 13, an emitter layer 14, and an emitter cap layer 15, sequentially stacked in this order on a gallium-arsenide substrate 10. The material composition of the base layer 13 is the key factor affecting the base-emitter turn-on voltage of the HBT. The base layer 13 is usually formed using materials such as gallium-arsenide (GaAs), indium-gallium-arsenic-nitride ($In_xGa_{1-x}As_yN_{1-y}$), or gallium-arsenide-antimonide ($GaAs_xSb_{1-x}$). Under a specific doping concentration, altering the x and y values of the above molecular formulas can control the energy gap of the transistor base. A specific base-emitter turn-on voltage is thereby achieved.

SUMMARY OF THE INVENTION

The present invention provides a new structure for HBTs. According to the present invention, the transistor base of a HBT contains multiple layers of gallium-arsenide-antimonide ($GaAs_xSb_{1-x}$, $0.0 \leq x \leq 1.0$) and/or indium-gallium-arsenic-nitride ($In_yGa_{1-y}As_zN_{1-z}$, $0.0 \leq y, z \leq 1.0$) arranged in a specific order.

The energy gap of the HBT base according to the present invention is determined, on one hand, by the material composition (namely, the x, y, z values) of the multiple layers of gallium-arsenide-antimonide ($GaAs_xSb_{1-x}$, $0.0 \leq x \leq 1.0$) and/or indium-gallium-arsenic-nitride ($In_yGa_{1-y}As_zN_{1-z}$, $0.0 \leq y, z \leq 1.0$) forming the HBT base. On the other hand, the energy gap of the HBT base can be further controlled by varying the thickness and arranging the order of the multiple layers of gallium-arsenide-antimonide ($GaAs_xSb_{1-x}$, $0.0 \leq x \leq 1.0$) and/or indium-gallium-arsenic-nitride ($In_yGa_{1-y}As_zN_{1-z}$, $0.0 \leq y, z \leq 1.0$) forming the HBT base. This allows the manufacturer another dimension of control over the energy gap of the transistor base, which is directly related to the base-emitter turn-on voltage of the HBT.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
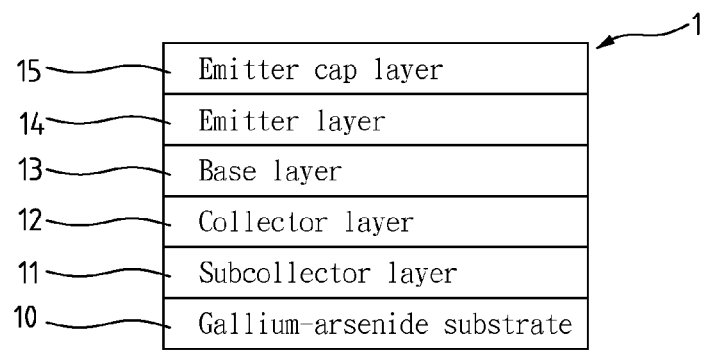
FIG. 1 shows a structure of a typical HBT according to a prior art.
Figure 2:
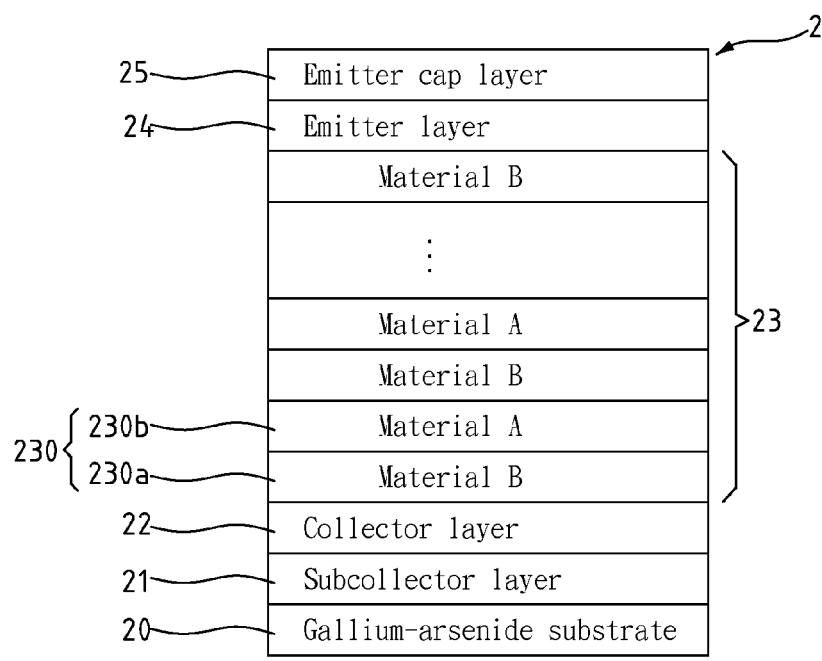
FIG. 2 shows a structure of a HBT according to a first embodiment of the present invention.

With reference to the drawings and in particular to FIG. 2, which shows the structure of a HBT according to a first embodiment of the present invention. As shown in FIG. 2, the epitaxy structure 2 of the HBT contains a subcollector layer 21, a collector layer 22, a base layer 23, an emitter layer 24, and an emitter cap layer 25, sequentially stacked in this order from bottom to top on a gallium-arsenide substrate 20.

The base layer 23 further contains at least an intermediate layer 230. The intermediate layer 230 includes a first base layer 230a and a second base layer 230b stacked upon the first base layer 230a in the direction toward the emitter layer. The base layer 23 can have multiple intermediate layers 230, sequentially stacked on the collector layer 22. On the topmost intermediate layer 230 and beneath the emitter layer 24, the base layer 23 can further contain an optional first base layer 230a as shown in FIG. 2.

Figure 3:
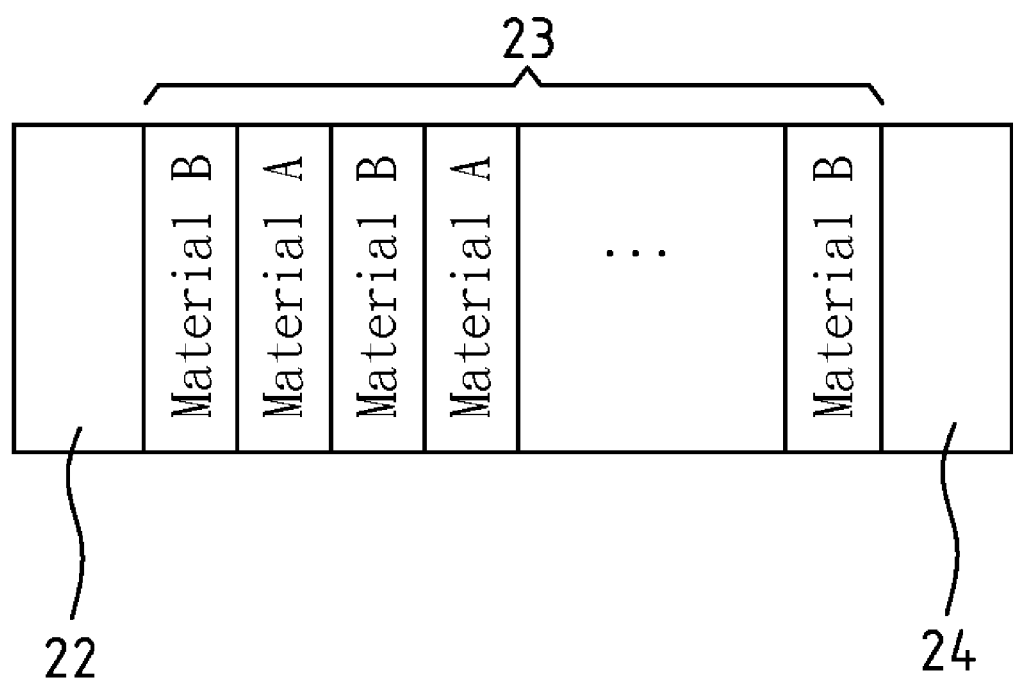
FIG. 3 shows a base layer structure of the HBT according to the first embodiment of the present invention.

In the following explanation to the various variations of the embodiments of the present invention, only the base layer 23 structure is depicted in the rest of the accompany drawings, as illustrated in FIG. 3 which shows the same base layer structure of the HBT of FIG. 2.

The first base layer 230a can be made of gallium-arsenide-antimonide ($GaAs_xSb_{1-x}$, $0.0 \leq x \leq 1.0$) or gallium-arsenide (GaAs) when x=1.0 in the molecular formula $GaAs_xSb_{1-x}$. The first base layer 230a can have a thickness between 1-300 Å. On the other hand, the second base layer 230b can also be made of gallium-arsenide-antimonide ($GaAs_pSb_{1-p}$, $0.0 \leq p \leq 1.0$) or gallium-arsenide (GaAs) when p=1.0 in the molecular formula $GaAs_pSb_{1-p}$. Please note that, if the first and second base layers 230a and 230b are made of the same type of material such as $GaAs_xSb_{1-x}$ and $GaAs_pSb_{1-p}$, their material composition must be different (that is, x≠p in the previous molecular formulas). The second base layer 230b can also have a thickness between 1-300 Å. In the following description and in the accompany drawings, gallium-arsenide-antimonide ($GaAs_xSb_{1-x}$, $0.0 \leq x \leq 1.0$) of a specific composition is referred to as material A, and gallium-arsenide-antimonide ($GaAs_pSb_{1-p}$, $0.0 \leq p \leq 1.0$) of another specific composition different from that of material A is referred to as material B.

By controlling the thickness of each of the base layers 230a and 230b, the composition of materials A, B, the number of intermediate layers 230 interposed between the collector layer 22 and the emitter layer 24, the base layer 23 can have a specific base-emitter turn-on voltage. Besides, the choice of materials for the first and second base layers 230a and 230b (thereby establishing a specific interleaving arrangement of materials A, B) would also affect the HBT's base-emitter turn-on voltage.

Figure 4A:
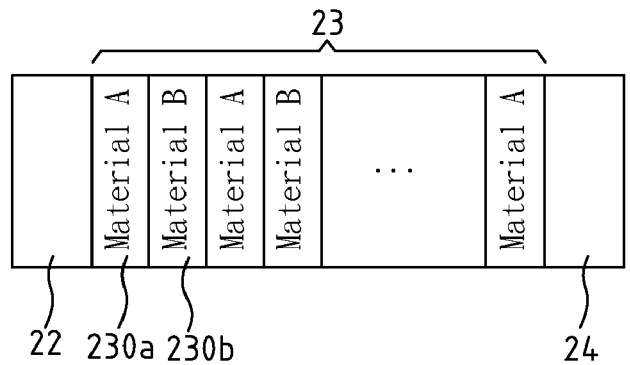
FIGS. 4(a) through 4(d) show various variations of the base layer structure of the HBT according to the first embodiment of the present invention.
Figure 4B:
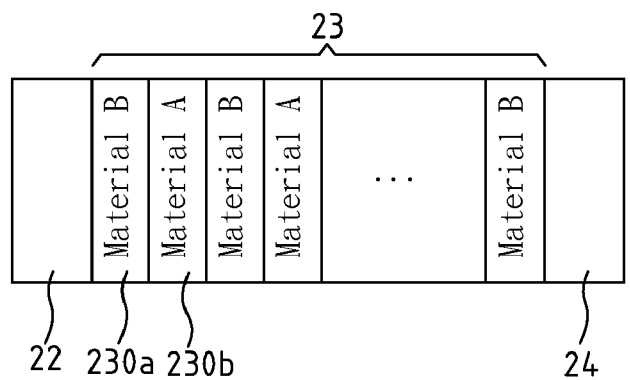
Figure 4C:
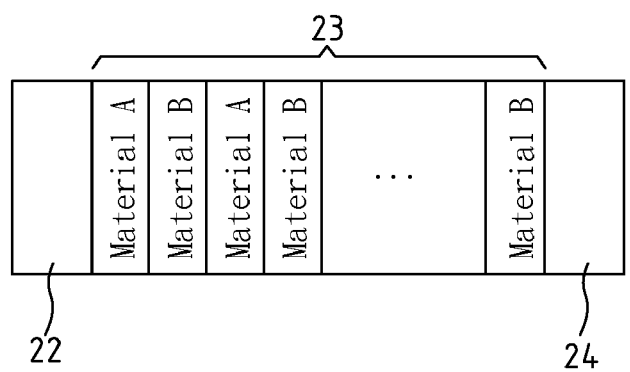
Figure 4D:
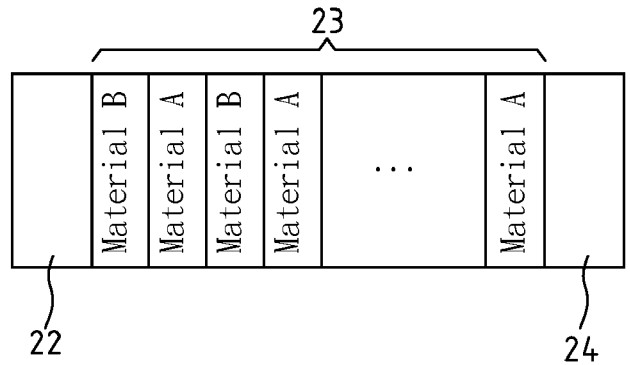

FIGS. 4(a) through 4(d) show various variations of the base layer structure according to the first embodiment of the present invention. As shown in FIGS. 4(a) and 4(c), the first base layer 230a is made of the material A and the second base layer 230b is made of the material B. The base layer depicted in structure FIG. 4(a) contains at least an intermediate layer 230 and an additional first base layer 230a (of material A) right next to the emitter layer 24. FIG. 4(c) has a structure identical to that of FIG. 4(a) except that there is no additional first base layer 230a (of material A) in FIG. 4(c). FIGS. 4(b) and 4(d) are exactly like FIGS. 4(a) and 4(c) except that, in FIGS. 4(b) and 4(d), the first base layer 230a is made of the material B and the second base layer 230b is made of the material A.

Figure 4E:
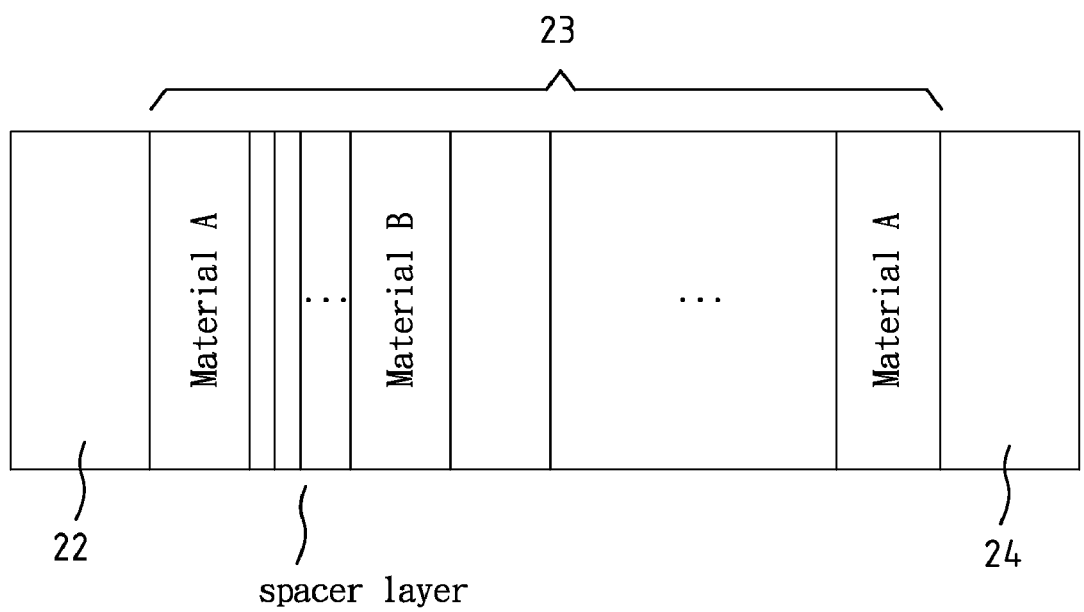
FIG. 4(e) shows a spacer layer between a pair of immediately adjacent first and second base layers.

In all the afore-mentioned structures depicted in FIGS. 4(a) through 4(d), if required, a spacer layer as shown in FIG. 4(e) can be optionally interposed between any pair of immediately adjacent first and second base layers 230a and 230b, regardless of whether the adjacent first and second base layers 230a and 230b are within the same intermediate layer or not. The spacer layer is made of gallium-arsenide-antimonide (GaAs$_a$Sb$_{1-a}$, $0.0 \leq a \leq 1.0$) or indium-gallium-arsenic-nitride (In$_b$Ga$_{1-b}$As$_c$N$_{1-c}$, $0.0 \leq b$, $c \leq 1.0$) having a graded composition that is different from the materials used to make the first and second base layers 230a and 230b. Specifically speaking, the a, b, and c parameters in the molecular formulas of gallium-arsenide-antimonide (GaAs$_a$Sb$_{1-a}$, $0.0 \leq a \leq 1.0$) or indium-gallium-arsenic-nitride (In$_b$Ga$_{1-b}$As$_c$N$_{1-c}$, $0.0 \leq b$, $c \leq 1.0$) forming the spacer layer changes gradually from low to high or from high to low monotonously along the direction from the collector layer 22 to the emitter layer 24. For example, a spacer layer made of GaAs$_a$Sb$_{1-a}$ having a thickness of 30 Å is interposed between a first base layer 230a made of GaAs and a second base layer 230b made of GaAs$_{0.9}$Sb$_{0.1}$. Within the 30 Å thickness, the spacer layer has a parameter in its composition GaAs$_a$Sb$_{1-a}$ gradually varies from 1.0 to 0.9.

A similar but different approach is that the spacer layer further contains multiple sub-spacer layers. Each of the sub-spacer layers is made of gallium-arsenide-antimonide (GaAs$_a$Sb$_{1-a}$, $0.0 \leq a \leq 1.0$) or indium-gallium-arsenic-nitride (In$_b$Ga$_{1-b}$As$_c$N$_{1-c}$, $0.0 \leq b$, $c \leq 1.0$) with a specific a, b, and c values that are different from the materials used to make the adjacent sub-spacer layers, the first and second base layers 230a and 230b. For example, three sub-spacer layers are interposed between a first base layer 230a made of GaAs and a second base layer 230b made of GaAs$_{0.9}$Sb$_{0.1}$ within an intermediate layer 23. The three sub-spacer layers are made of GaAs$_{0.97}$Sb$_{0.03}$ (a=0.97), GaAs$_{0.95}$Sb$_{0.05}$ (a=0.95), and GaAs$_{0.92}$Sb$_{0.08}$ (a=0.92) and have a thickness of 40 Å, 35 Å, and 30 Å respectively. Each sub-space layer can have a thickness between 1-300 Å.

Figure 5A:
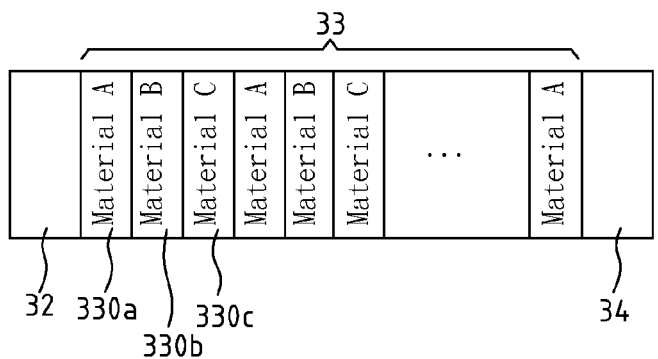
FIGS. 5(a) through 5(r) show various variations of the base layer structure of a HBT according to a second embodiment of the present invention.
Figure 5B:
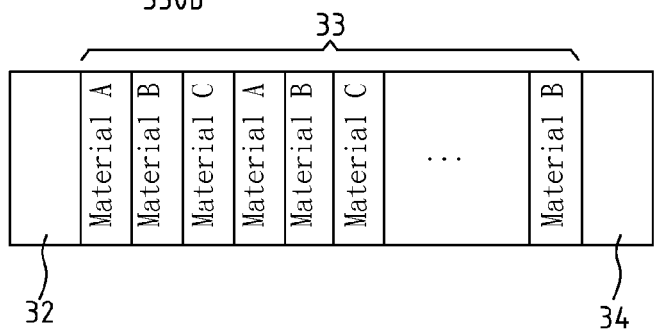
Figure 5C:
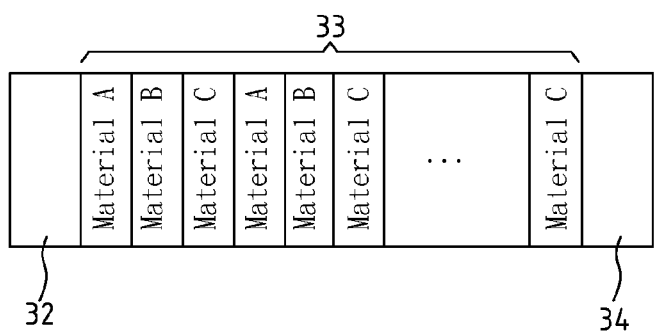
Figure 5D:
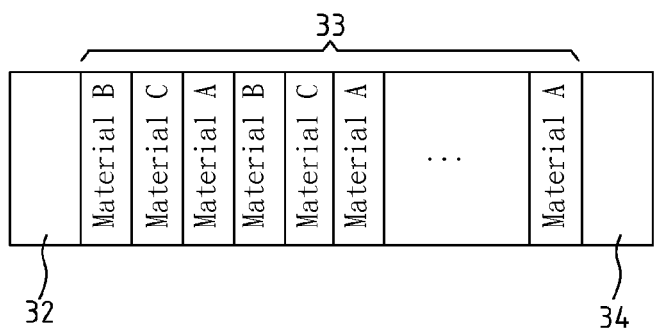
Figure 5E:
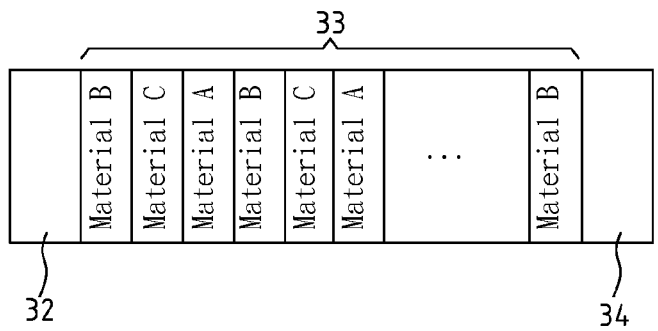
Figure 5F:
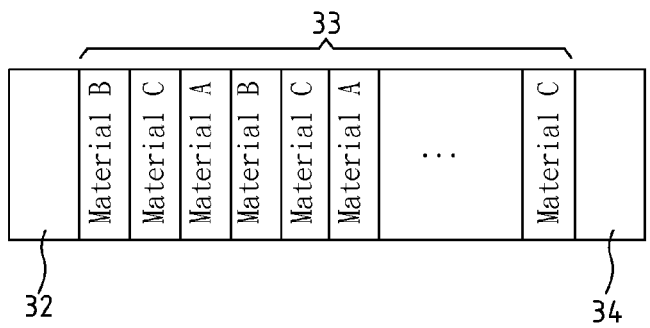
Figure 5G:
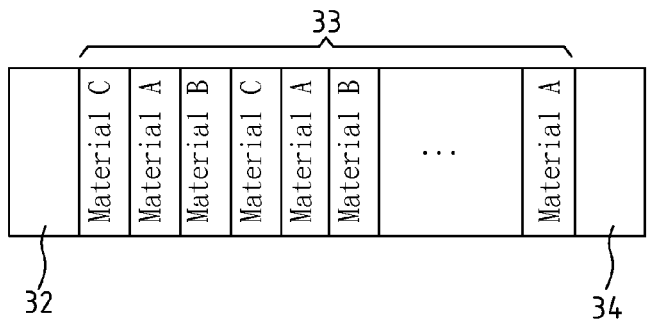
Figure 5H:
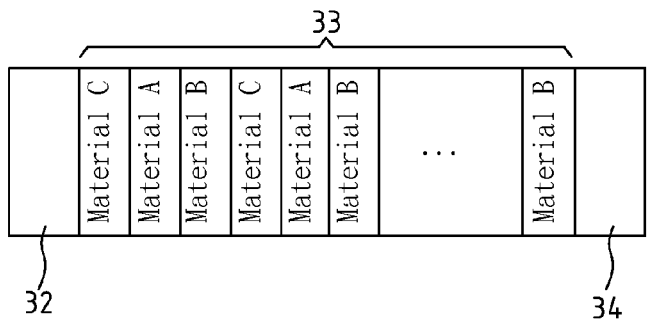
Figure 5I:
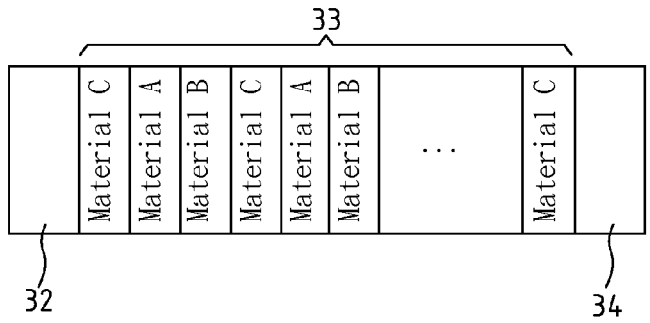
Figure 5J:
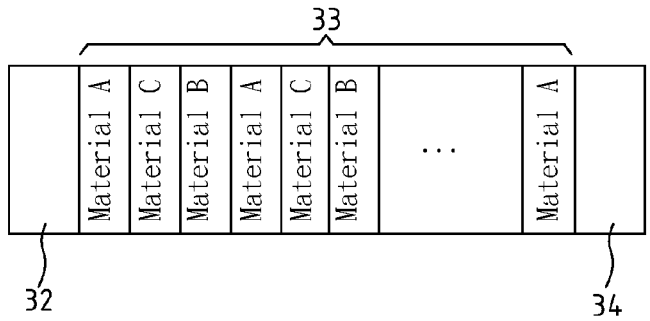
Figure 5K:
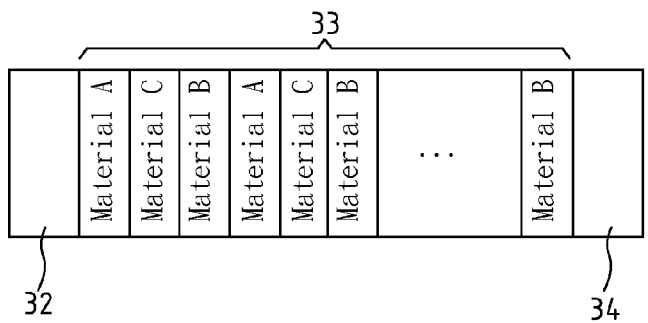
Figure 5L:
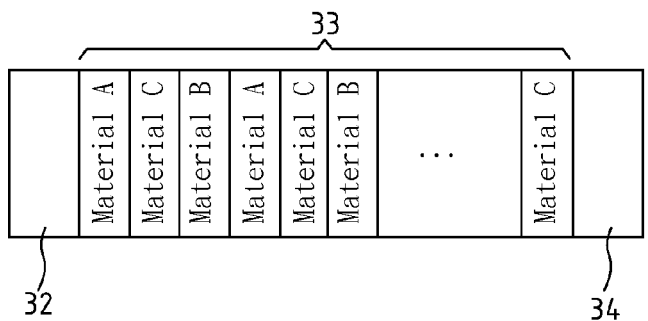
Figure 5M:
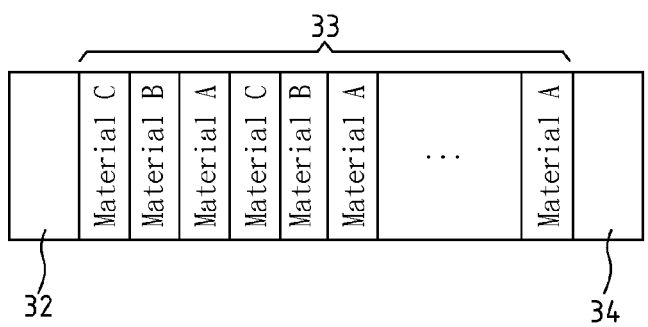
Figure 5N:
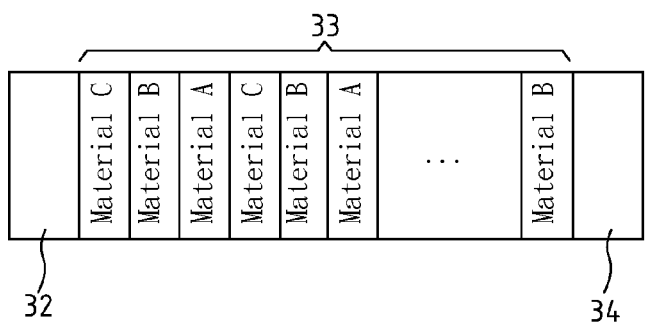
Figure 5O:
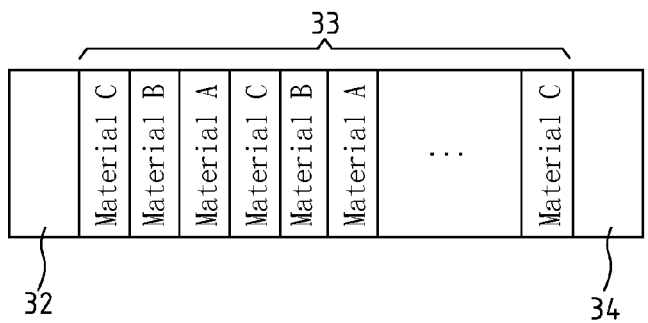
Figure 5P:
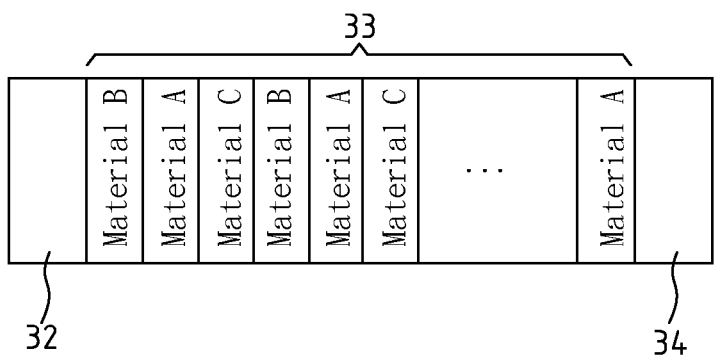
Figure 5Q:
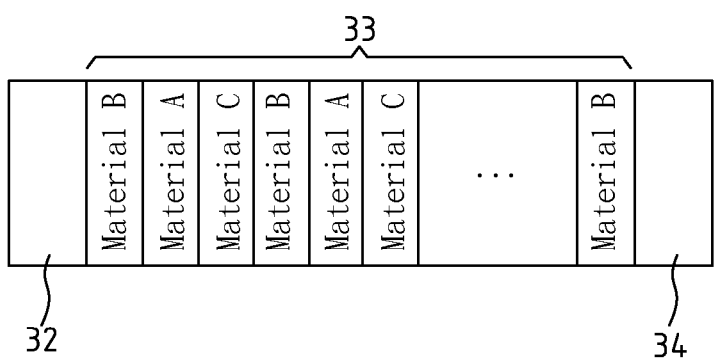
Figure 5R:
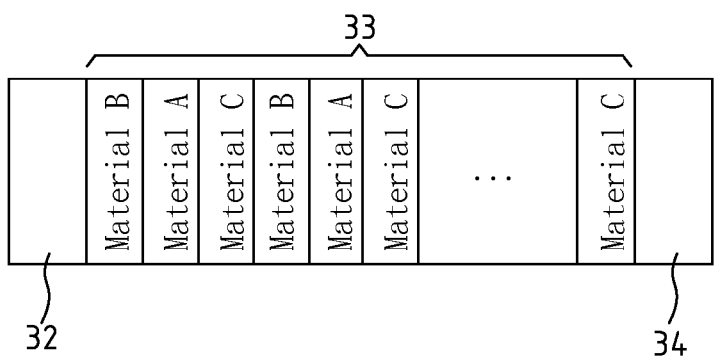

FIGS. 5(a) through 5(r) show various variations of the base layer structure according to the second embodiment of the present invention. Using FIG. 5(a) as an example, the base layer 33 between the collector layer 32 and the emitter layer 34 contains at least an intermediate layer 330. The intermediate layer 330 consists of a first base layer 330a, a second base layer 330c, and a third based layer 330b interposed between the first and second base layers 330a and 330c. The three base layers 330a, 330b, and 330c are stacked in the direction toward the emitter layer 34. The base layer 33 can have multiple intermediate layers 330, sequentially stacked on the collector layer 32. On the topmost intermediate layer 330 and beneath the emitter layer 34, the base layer 33 can further contain an optional first base layer 330a or third base layer 330b.

All three base layers 330a, 330b, and 330c can have a thickness between 1-300 Å. The first base layer 330a can be made of gallium-arsenide-antimonide (GaAs$_x$Sb$_{1-x}$, $0.0 \leq x \leq 1.0$) or indium-gallium-arsenic-nitride (In$_y$Ga$_{1-y}$As$_z$N$_{1-z}$, $0.0 \leq y$, $z \leq 1.0$) which is referred to as material C. The first base layer 330a can also be made of gallium-arsenide (GaAs) when x=1.0 in the molecular formula GaAs$_x$Sb$_{1-x}$ or when y=0.0 and z=1.0 in the molecular formula In$_y$Ga$_{1-y}$As$_z$N$_{1-z}$. The second base layer 330c can also be made of gallium-arsenide-antimonide (GaAs$_p$Sb$_{1-p}$, $0.0 \leq p \leq 1.0$) or indium-gallium-arsenic-nitride (In$_q$Ga$_{1-q}$As$_r$N$_{1-r}$, $0.0 \leq q$, $r \leq 1.0$). The second base layer 330c can also be made of gallium-arsenide (GaAs) when p=1.0 in the molecular formula GaAs$_p$Sb$_{1-p}$ or when q=0.0 and r=1.0 in the molecular formula In$_q$Ga$_{1-q}$As$_r$N$_{1-r}$. The third base layer 330b can also be made of gallium-arsenide-antimonide (GaAs$_t$Sb$_{1-t}$, $0.0 \leq t \leq 1.0$) or indium-gallium-arsenic-nitride (In$_u$Ga$_{1-u}$As$_v$N$_{1-v}$, $0.0 \leq u$, $v \leq 1.0$). The third base layer 330b can be made of gallium-arsenide (GaAs) when t=1.0 in the molecular formula GaAs$_t$Sb$_{1-t}$ or when u=0.0 and v=1.0 in the molecular formula In$_u$Ga$_{1-u}$As$_v$N$_{1-v}$. Please note that, if all three base layers 330a, 330b, and 330c are made of the same type of material such as GaAs$_x$Sb$_{1-x}$, GaAs$_p$Sb$_{1-p}$, and GaAs$_t$Sb$_{1-t}$, their material composition must be different (that is, $x \neq p \neq t$ in the previous molecular formulas).

Exactly like the first embodiment of the present invention, if required, a spacer layer similar to that shown in FIG. 4(e) can be optionally interposed between any pair of immediately adjacent first, second, and third base layers 330a, 330b, and 330c, regardless of whether the adjacent first, second, and third base layers 330a, 330b, and 330c are within the same intermediate layer or not. Each of the spacer layer can have a thickness between 1-300 Å and can be made of gallium-arsenide-antimonide (GaAs$_a$Sb$_{1-a}$, $0.0 \leq a \leq 1.0$) or indium-gallium-arsenic-nitride (In$_b$Ga$_{1-b}$As$_c$N$_{1-c}$, $0.0 \leq b$, $c \leq 1.0$) that is different from the materials used for the base layers at its sides. If only one spacer layer is used, the spacer layer can have a graded composition as described in the previous embodiment of the present invention. Besides using a graded composition, another approach for the spacer layer is to contain multiple sub-spacer layers. Each of the sub-spacer layers is made of gallium-arsenide-antimonide (GaAs$_a$Sb$_{1-a}$, $0.0 \leq a \leq 1.0$) or indium-gallium-arsenic-nitride (In$_b$Ga$_{1-b}$As$_c$N$_{1-c}$, $0.0 \leq b$, $c \leq 1.0$) with specific a, b, and c values that are different from the materials used to make the adjacent sub-spacer layers, the first, second, and second base layers 330a, 330b, and 330c. For example, a spacer layer made of GaAs$_a$Sb$_{1-a}$ having a thickness of 30 Å is interposed between a first base layer 330a made of GaAs and a third base layer 330b made of GaAs$_{0.9}$Sb$_{0.1}$. Within the 30 Å thickness, the spacer layer has the a parameter in its composition GaAs$_a$Sb$_{1-a}$ gradually varies from 1.0 to 0.9. For another example, three sub-spacer layers are interposed between a first base layer 330a made of GaAs and a third base layer 330b made of GaAs$_{0.9}$Sb$_{0.1}$. The three spacer layers are made of GaAs$_{0.97}$Sb$_{0.03}$ (a=0.97), GaAs$_{0.95}$Sb$_{0.05}$ (a=0.95), and GaAs$_{0.92}$Sb$_{0.08}$ (a=0.92) respectively and have a thickness of 40 Å, 35 Å, and 30 Å respectively.

In FIGS. 5(a) through 5(c), the first, third, and second base layers 330a, 330b, 330c are made of material A, B, and C respectively. As shown in FIG. 5(a), an optional fist base layer 330a is on the topmost intermediate layer 330 and beneath the emitter layer 34. On the other hand, as shown in FIG. 5(b), an optional third base layer 330b is on the topmost intermediate layer 330 and beneath the emitter layer 34. The FIGS. 5(d) through 5(r) are exactly like the FIGS. 5(a)

through 5(c) except that different materials are used for the first, third, and second base layers respectively.

Although the present invention has been described with reference to the preferred embodiments, it will be understood that the invention is not limited to the details described thereof. Various substitutions and modifications have been suggested in the foregoing description, and others will occur to those of ordinary skill in the art (such as arranging gallium-arsenide-antimonide (GaAs$_x$Sb$_{1-x}$, 0.0≦x≦1.0), or indium-gallium-arsenic-nitride (In$_y$Ga$_{1-y}$As$_z$N$_{1-z}$, 0.0≦y, z≦1.0) in a specific order as the transistor base of a HBT). Therefore, all such substitutions and modifications are intended to be embraced within the scope of the invention as defined in the appended claims.

What is claimed is:

1. A structure of a heterojunction bipolar transistor, comprising:
    a substrate made of gallium-arsenide (GaAs);
    a subcollector layer located over said substrate;
    a collector layer located over said subcollector layer;
    a base layer located over said collector layer;
    an emitter layer located over said base layer; and
    an emitter cap layer located over said emitter layer,
    wherein said base layer comprises at least an intermediate layer sequentially stacked between said collector layer and said emitter layer, and said intermediate layer comprises a first base layer and a second base layer located over said first base layer, said first base layer and said second base layer being made of gallium-arsenide-antimonide (GaAs$_x$Sb$_{1-x}$, 0.0≦x≦1.0) with different material compositions.

2. The structure of a heterojunction bipolar transistor according to claim 1, wherein said base layer further comprises an additional first base layer located beneath said emitter layer and over a topmost intermediate layer.

3. The structure of a heterojunction bipolar transistor according to claim 1, wherein said base layer comprises at least two intermediate layers forming multiple said first and second base layers sequentially stacked between said collector layer and said emitter layer, and a spacer layer is located between each pair of immediately adjacent first and second base layers.

4. The structure of a heterojunction bipolar transistor according to claim 1, wherein said first base layer and said second base layer have a thickness between 1-300 Å.

5. The structure of a heterojunction bipolar transistor according to claim 3, wherein said spacer layer has a thickness between 1-300 Å.

6. The structure of a heterojunction bipolar transistor according to claim 3, wherein said spacer layer is made of a material selected from the group consisting of gallium-arsenide-antimonide (GaAs$_a$Sb$_{1-a}$, 0.0≦a≦1.0) and indium-gallium-arsenic-nitride (In$_b$Ga$_{1-b}$As$_c$N$_{1-c}$, 0.0≦b, c≦1.0) with a graded composition having a, b, and c values varying gradually and monotonically between two layers adjacent to said spacer layer.

7. The structure of a heterojunction bipolar transistor according to claim 3, wherein said spacer layer comprises a plurality of sequentially stacked sub-spacer layers, each of which is made of a material selected from the group consisting of gallium-arsenide-antimonide (GaAs$_a$Sb$_{1-a}$, 0.0≦a≦1.0) and indium-gallium-arsenic-nitride (In$_b$Ga$_{1-b}$As$_c$N$_{1-c}$, 0.0≦b, c≦1.0) with specific a, b, and c values that are different from the values of the materials used to make adjacent sub-spacer layers, and adjacent first and second base layers.

8. A structure of a heterojunction bipolar transistor, comprising:
    a substrate made of gallium-arsenide (GaAs);
    a subcollector layer located over said substrate;
    a collector layer located over said subcollector layer;
    a base layer located over said collector layer;
    an emitter layer located over said base layer; and
    an emitter cap layer located over said emitter layer,
    wherein said base layer comprises at least an intermediate layer sequentially stacked between said collector layer and said emitter layer, and said intermediate layer comprises a first base layer, a third base layer located over said first base layer, and a second base layer located over said third base layer, said first base layer, said third base layer, and said second base layer having different material compositions and being made of a material selected from the group consisting of gallium-arsenide-antimonide (GaAs$_x$Sb$_{1-x}$, 0.0≦x≦1.0) and indium-gallium-arsenic-nitride (In$_y$Ga$_{1-y}$As$_z$N$_{1-z}$, 0.0≦y, z≦1.0), and wherein said base layer further comprises an additional first base layer located beneath said emitter layer and over a topmost intermediate layer.

9. The structure of a heterojunction bipolar transistor according to claim 8, wherein said base layer comprises at least two intermediate layers forming multiple said first, third and second base layers sequentially stacked between said collector layer and said emitter layer, and a spacer layer is located between each pair of immediately adjacent first, third, or second base layers.

10. The structure of a heterojunction bipolar transistor according to claim 8, wherein said first base layer, said third base layer, and said second base layer have a thickness between 1~300 Å.

11. The structure of a heterojunction bipolar transistor according to claim 9, wherein said spacer layer has a thickness between 1~300 Å.

12. The structure of a heterojunction bipolar transistor according to claim 9, wherein said spacer layer is made of a material selected from the group consisting of gallium-arsenide-antimonide (GaAs$_a$Sb$_{1-a}$, 0.0≦a≦1.0) and indium-gallium-arsenic-nitride (In$_b$Ga$_{1-b}$As$_c$N$_{1-c}$, 0.0≦b, c≦1.0) with a graded composition having a, b, and c values varying gradually and monotonically between two immediate layers adjacent to said spacer layer.

13. The structure of a heterojunction bipolar transistor according to claim 9, wherein said spacer layer comprises a plurality of sequentially stacked sub-spacer layers, each of which is made of a material selected from the group consisting of gallium-arsenide-antimonide (GaAs$_a$Sb$_{1-a}$, 0.0≦a≦1.0) and indium-gallium-arsenic-nitride (In$_b$Ga$_{1-b}$As$_c$N$_{1-c}$, 0.0≦b, c≦1.0) with specific a, b, and c values that are different from the values of the materials used to make adjacent sub-spacer layers, and adjacent first, third, and second base layers.

14. A structure of a heterojunction bipolar transistor, comprising:
    a substrate made of gallium-arsenide (GaAs);
    a subcollector layer located over said substrate;
    a collector layer located over said subcollector layer;
    a base layer located over said collector layer;
    an emitter layer located over said base layer; and
    an emitter cap layer located over said emitter layer,
    wherein said base layer comprises at least an intermediate layer sequentially stacked between said collector layer and said emitter layer, and said intermediate layer comprises a first base layer, a third base layer located over said frist base layer, and a second base layer located over said third base layer, said first base layer, said third base layer, and said second base layer having different material compositions and being made of a material selected from the group consisting of gallium-arsenide-antimonide ($GaAs_xSb_{1-x}$, $0.0 \leq x \leq 1.0$) and indium-gallium-arsenic-nitride ($In_yGa_{1-y}As_zN_{1-z}$, $0.0 \leq y, z \leq 1.0$), and wherein said base layer further comprises an additional third base layer located beneath said emitter layer and over a topmost intermediate layer.

* * * * *